United States Patent
Tran et al.

(10) Patent No.: US 11,722,130 B1
(45) Date of Patent: Aug. 8, 2023

(54) SYSTEM AND METHOD FOR DISTINGUISHING SHORT-CIRCUIT EVENTS IN HIGH INRUSH CURRENT SYSTEMS

(71) Applicant: LEACH INTERNATIONAL CORPORATION, Buena Park, CA (US)

(72) Inventors: Anhtai Le Tran, Garden Grove, CA (US); Imtiaz Ahmad Khan, Trabuco Canyon, CA (US); Farshid Tofigh, Mission Viejo, CA (US); Chad Uyehara, Honolulu, HI (US); Tony Hana, Anaheim, CA (US)

(73) Assignee: LEACH INTERNATIONAL CORPORATION, Buena Park, CA (US)

( * ) Notice: Subject to any disclaimer, the term of this patent is extended or adjusted under 35 U.S.C. 154(b) by 0 days.

(21) Appl. No.: 17/734,584

(22) Filed: May 2, 2022

(51) Int. Cl.
*H03K 17/082* (2006.01)
*H02H 3/087* (2006.01)
*H01L 27/02* (2006.01)

(52) U.S. Cl.
CPC ..... *H03K 17/0822* (2013.01); *H01L 27/0285* (2013.01); *H02H 3/087* (2013.01)

(58) Field of Classification Search
CPC . H03K 17/08–0828; H02H 3/08; H02H 3/087
See application file for complete search history.

(56) References Cited

U.S. PATENT DOCUMENTS

| | | | |
|---|---|---|---|
| 6,703,889 B2 | 3/2004 | Dodson, III | |
| 8,553,373 B2 | 10/2013 | Rozman et al. | |
| 8,582,262 B2 | 11/2013 | Divan | |
| 10,177,554 B2 | 1/2019 | Wu et al. | |
| 10,263,414 B2 | 4/2019 | Hou et al. | |
| 10,289,137 B2 | 5/2019 | Leong et al. | |
| 10,566,787 B2 | 2/2020 | Rodrigues et al. | |
| 10,720,768 B2 | 7/2020 | Asanza Maldonado | |
| 2017/0069441 A1* | 3/2017 | Mishrikey | H02H 9/001 |
| 2018/0323608 A1 | 11/2018 | Guerrero et al. | |

(Continued)

FOREIGN PATENT DOCUMENTS

| | | |
|---|---|---|
| JP | 2000-358377 A | 12/2000 |
| JP | 5445192 B2 | 3/2014 |

OTHER PUBLICATIONS

International Search Report issued in corresponding international application No. PCT/US2022/027295, dated Jan. 30, 2023, 4 pages.

(Continued)

*Primary Examiner* — Jared Fureman
*Assistant Examiner* — Christopher J Clark
(74) *Attorney, Agent, or Firm* — Lewis Roca Rothgether Christie LLP

(57) ABSTRACT

A method of protecting a load circuit includes sensing a load current passing through a switch electrically in series with the load circuit, sensing a voltage drop across the switch, determining a rate of change of the voltage drop across the switch, determining whether to deactivate the switch based on the load current and the rate of change of the voltage drop across the switch, in response to determining to deactivate the switch, deactivating the switch to shut off current to the load circuit.

17 Claims, 9 Drawing Sheets

(56) References Cited

U.S. PATENT DOCUMENTS

| | | |
|---|---|---|
| 2019/0011492 A1* | 1/2019 | Handy ................. G01R 31/008 |
| 2019/0190512 A1 | 6/2019 | Takuma |
| 2020/0064875 A1 | 2/2020 | Gonapati et al. |
| 2020/0177179 A1* | 6/2020 | Butenhoff .......... H03K 19/0185 |
| 2020/0366078 A1 | 11/2020 | Telefus et al. |
| 2021/0143634 A1 | 5/2021 | Molligoda et al. |
| 2021/0249955 A1 | 8/2021 | Routledge |

OTHER PUBLICATIONS

Written Opinion issued in corresponding international application No. PCT/US2022/027295, dated Jan. 30, 2023, 6 pages.

* cited by examiner

SYSTEM AND METHOD FOR DISTINGUISHING SHORT-CIRCUIT EVENTS IN HIGH INRUSH CURRENT SYSTEMS

FIELD

Aspects of embodiments of the present disclosure are generally related to circuit breaker systems.

BACKGROUND

In electrical power systems, switchgears with protection devices such as solid state power controllers (SSPCs) are used to control system loads and protect wires from fault current or short-circuit current. These devices use information about load current to react to abnormal conditions. The high inrush current demanded by highly capacitive loads can be misinterpreted by these devices as fault current. This problem is further aggravated at higher voltage application, when the inrush current of capacitive loads is much higher, and indistinguishable from a short-circuit current. The switchgears of the related art with protection device detect these large inrush current as fault current and erroneously turn off the load resulting in a false trip condition in the system.

Some existing techniques deal with this problem by reducing the inrush current. In some systems, pre-charge circuits are used with the capacitive loads to limit the inrush current. This technique does not affect the short-circuit detection of the upstream protection devices for the wire between the source and load; however, it does slow down the turn-on response time of the load, which is undesirable. Further, the pre-charge circuitry requires additional control hardware and can be sizable, requiring bulky components for power dissipation. In airborne applications, where weight is a critical factor, this is not a favorable option.

In some other systems, various active current limiting techniques including soft-start are used within the SSPC to reduce the inrush current into the capacitive load. Soft-start invariably requires switching devices such as MOSFETs or IGBTs to be operated in their active region of operation which then adds to the complexity of the circuit designed to protect them from damage due to excessive power dissipation. Further, soft-start circuits undesirably slow down the turn-on time of the system, which may be unacceptable in certain applications.

Traditional short-circuit detection is based on the load current exceeding a predetermined trip threshold value. The short-circuit trip value is usually set to be ten times the nominal load current rating. When utilizing current limiting technique, short-circuit current is also limited in a short-circuit event, which can interfere with the traditional short-circuit detection method. When the traditional short-circuit detection method is modified to set the trip threshold being equal to or less than the limiting load current, the short-circuit is detected when the current exceeds this lower trip threshold and persists longer than a predetermined time to allow the inrush current to be reduced below the trip point. This implementation causes a slow protection response time to avoid false trip. To prevent nuisance trip, the short-circuit detection system may be great in size and weight to manage the additional power dissipation during this wait time to prevent damage to the solid-state switch. In addition, in high voltage system such as 270 VDC and 540 VDC, slow short-circuit detection may cause fault current or an arc-fault causing a catastrophic event.

The above information disclosed in this Background section is only for enhancement of understanding of the present disclosure, and therefore it may contain information that does not form the prior art that is already known to a person of ordinary skill in the art.

SUMMARY

Aspects of embodiments of the present disclosure are directed to a system and method for protecting a load or wire against fault and short circuit currents, while allowing fast charging of capacitive loads. A protection device, according to some embodiments, is capable of quickly distinguishing between the high inrush current of capacitive loads and short circuit events, which allows the protection device to rapidly charge and provide power to a capacitive load, and also to rapidly turn off (trip) in the case of a short circuit event to protect wiring and prevent device failure.

According to some embodiments of the present disclosure, there is provided a method of protecting a load circuit, the method including: sensing a load current passing through a switch electrically in series with the load circuit; sensing a voltage drop across the switch; determining a rate of change of the voltage drop across the switch; determining whether to deactivate the switch based on the load current and the rate of change of the voltage drop across the switch; and in response to determining to deactivate the switch, deactivating the switch to shut off current to the load circuit.

In some embodiments, the determining whether to deactivate the switch includes: determining whether the load current is above a first threshold; determining whether the rate of change of the voltage drop is less than a second threshold; and in response to determining that the load current is above the first threshold and that the rate of change of the voltage drop is less than the second threshold, determining to deactivate the switch.

In some embodiments, the method further includes: in response to determining not to deactivate the switch, maintaining activation of the switch.

In some embodiments, the determining whether to deactivate the switch includes: determining whether the load current is above a first threshold; determining whether the rate of change of the voltage drop is less than a second threshold; and in response to determining that the load current is less than or equal to the first threshold or that the rate of change of the voltage drop is greater than or equal to the second threshold, determining not to deactivate the switch.

In some embodiments, the first threshold is less than a current rating of the switch.

In some embodiments, the switch includes a field effect transistor (FET).

According to some embodiments of the present disclosure, there is provided a protection device coupled to a load circuit, the protection device including: a switch electrically in series with the load circuit; a current sensor configured to sense a load current passing through the switch; a voltage sensor configured to measure a voltage drop across the switch; a detector configured to generate a switch control signal based on the load current and a rate of change of the voltage drop; and a gate driver configured to selectively activate and deactivate the switch based on the switch control signal.

In some embodiments, the switch includes: a field effect transistor (FET) having a gate electrode coupled to the gate driver, and a source electrode coupled to the load circuit.

In some embodiments, the current sensor includes: a sense resistor coupled electrically in series with the switch and the load circuit, and wherein the voltage sensor includes: an error amplifier having input terminals coupled across the switch and configured to generate a switch voltage corresponding to the voltage drop across the switch.

In some embodiments, the protection device further includes: a differentiator coupled between the voltage sensor and the detector, and configured to generate a derivative signal corresponding to the rate of change of the voltage drop across the switch based on a switch voltage from the voltage sensor.

In some embodiments, the detector is further configured to receive the voltage drop across the switch from the voltage sensor and to calculate the rate of change of the voltage drop based on the voltage drop.

In some embodiments, the detector is configured to perform: determining whether the load current is above a first threshold; determining whether the rate of change of the voltage drop is less than a second threshold; and in response to determining that the load current is above the first threshold and that the rate of change of the voltage drop is less than the second threshold, generating the switch control signal to correspond to deactivation of the switch.

In some embodiments, the detector is configured to perform: determining whether the load current is above a first threshold; determining whether the rate of change of the voltage drop is less than a second threshold; and in response to determining that the load current is less than or equal to the first threshold or that the rate of change of the voltage drop is greater than or equal to the second threshold, generating the switch control signal to correspond to maintaining activation of the switch.

In some embodiments, the protection device further includes: a current limiter circuit coupled between the gate driver and the switch, and configured to limit the load current to a current limit.

In some embodiments, the current limiter circuit includes: a bipolar junction transistor (BJT) having a base, an emitter, and a collector coupled to a gate of the switch, the current sensor being coupled between the base and emitter of the BJT.

In some embodiments, the protection device further includes: a controller configured to receive the load current and the voltage drop across the switch, and to signal the gate driver to deactivate the switch based on the load current and the voltage drop.

In some embodiments, the switch includes a field effect transistor (FET).

BRIEF DESCRIPTION OF THE DRAWINGS

The accompanying drawings, together with the specification, illustrate example embodiments of the present disclosure, and, together with the description, serve to explain the principles of the present disclosure.

DETAILED DESCRIPTION

The detailed description set forth below is intended as a description of example embodiments of a system and method for defect detection, provided in accordance with the present disclosure, and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Aspects of embodiments of the present disclosure are directed to a protection device that is used to control system loads and protect wires from fault currents or short-circuit currents. The invention is capable of quickly differentiating between resistive short-circuit currents and capacitive inrush currents by relying not only on the magnitude of the current passing through a power semiconductor (i.e., a solid-state switch) that is in line with the load, but also on the rate of change in voltage ($dV/dt$ or $dV_{DS}/dt$) across the drain to source of the power semiconductor. This allows the protection device to avoid nuisance trips (e.g., switch shutting off current on the wire in the case of a high inrush capacitive current charging the capacitive load) while facilitating simpler wire protection circuit designs to protect against short-circuit and overload conditions.

Figure 1:
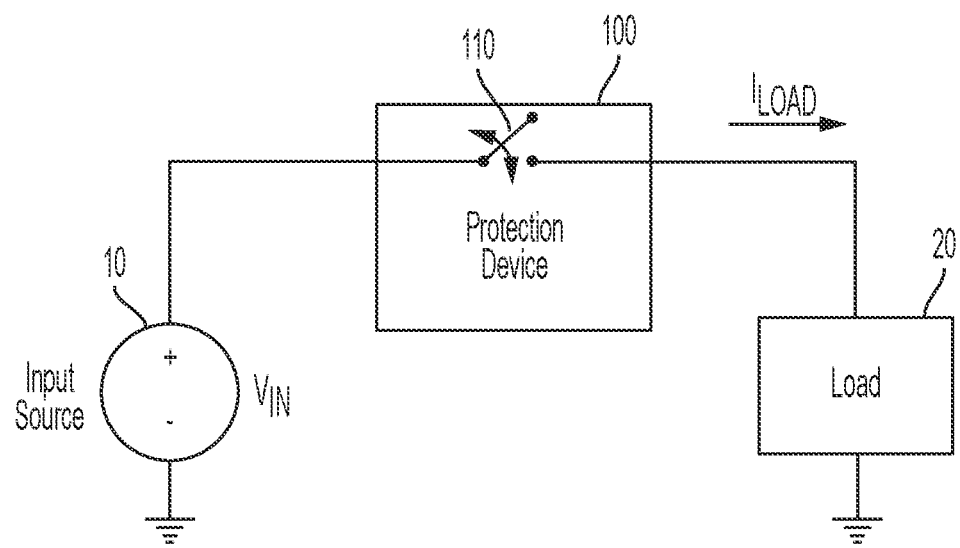
FIG. 1 illustrates a protection device coupled between an input power source and a load, according to some exemplary embodiments of the present disclosure.

FIG. 1 illustrates a protection device coupled between an input power source and a load, according to some exemplary embodiments of the present disclosure.

In some embodiments, the protection device 100 is in a current path between an input power source 10 and a system load (e.g., a load circuit) 20, and monitors and manages the transfer of electrical power between the input source 10 and the load 20. The protection device 100 may be configured to protect the wiring/cables and/or other equipment connected to the electrical load 20 from damage caused by excess current from a short circuit (e.g., a short circuit at the load 20). In other words, the protection device 110 interrupts current flow in response to a fault being detected. In some examples, the protection device 110 may be a circuit breaker (e.g., a thermal or remotely controlled circuit breaker), a fuse (e.g., a one-time fuse or a resettable fuse), or the like. The protection device 100 may accurately measure and report voltage and current measurements, provide low loss switching with controlled rise and fall times that can reduce EMI emissions, very rapid short circuit response, I2t (current squared through time) overload protection, and/or the like. The load 20 may, for example, be a conductive wire/cable, an external circuit, and/or the like.

When the protection device 100 is turned on into a short-circuit (i.e., when the load 20 is short-circuited), the resulting current ($I_{LOAD}$) is limited by the input source 10 and the impedance in the overall system. In such a case, almost the entire supply voltage $V_{IN}$ appears across the switch (e.g., the power semiconductor or solid state switch) 110 of the protection device 100, resulting in a high power dissipation. This condition continues until the switch 110 is turned off. The longer the protection device 100 remains in the on state, the higher the energy that is dissipated by the switch 110, which, if not prevented, may eventually result in its destruction.

When the protection device 100 is turned on into a yet uncharged capacitive load 20, the effective load impedance is initially a short-circuit resulting in high inrush current. In this instance also, a high voltage may be developed across the switch 110. As the capacitive load 20 charges, its voltage increases and the load current $I_{LOAD}$ decreases, thus reducing the voltage drop across the switch 110 over time.

The protection device 100 utilizes a method to differentiate between the inrush and the short-circuit current. According to some embodiments, the short-circuit detection utilized by the protection device 100 is based on not only the load current but also the time rate of change in the voltage (dV/dt) across the terminals of the switch 110. The protection device 100 monitors the load current $I_{LOAD}$ through the switch 110. In some embodiments, the protection device 100 utilizes a current limiter to prevent the load current $I_{LOAD}$ from exceeding a set value. This serves to maintain a constant current during a high current event (e.g., a short circuit or high inrush current event). The protection device 100 concurrently monitors the voltage change across the switch 110, and utilizes the change in voltage in combination with the current information to determine if the high current is a result of a capacitive inrush or a resistive short-circuit event.

During the capacitive inrush condition, the behavior of the change of voltage across the switch 110 is equivalent to the change of voltage across the capacitive load 20, which may be described by the following equation:

$$\frac{dV}{dt} = \frac{I}{C} \qquad \text{Eq. (1)}$$

The current (I) determines the rate of change of voltage developed across a given capacitive (C) load. The constant current is controlled by the protection device 100, therefore the dV/dt in the equation above can be accurately measured to determine the load capacitance value. In some examples, the constant current value (i.e., the current limit) is set to be below the maximum current that the switch 110 can withstand during the charging cycle without damage. For example, the current limit may be set to about 600 A, 1200 A, or any other value suitable for a desired application.

Figure 2:
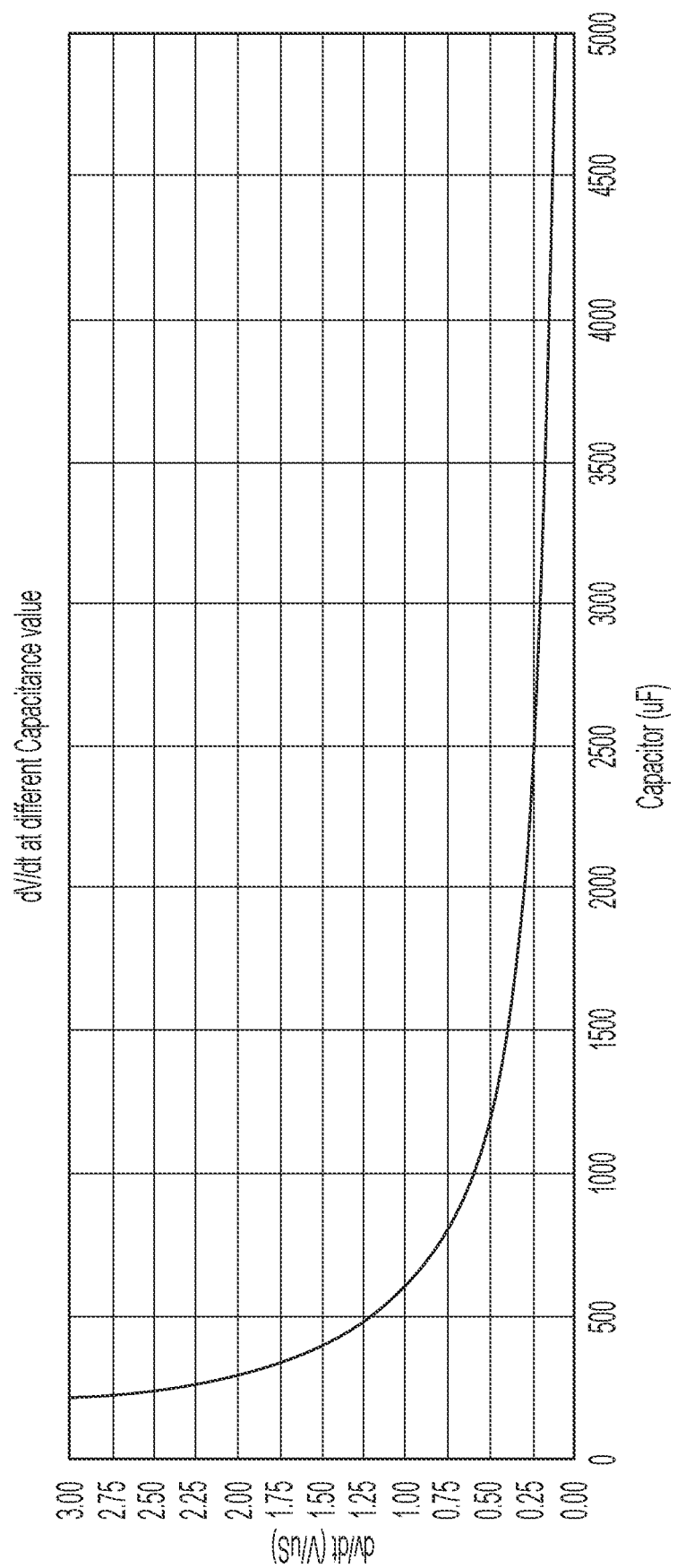
FIG. 2 illustrates the relationship being rate of change of switch voltage versus load capacitance for a constant-current scenario, according to some exemplary embodiments of the present disclosure.

FIG. 2 illustrates the relationship being rate of change of switch voltage versus load capacitance for a constant-current scenario, according to some exemplary embodiments of the present disclosure.

In the example of FIG. 2, the protection device 100 is operating in a current limit mode (e.g., one in which the current is capped at/limited to 600 A). As described in Equation (1) and shown in FIG. 2, the smaller the capacitance value of the load 20, the higher the rate of change of the switch voltage (dV/dt). Likewise, the larger the capacitance value, the smaller the dV/dt value. In some embodiments, when the current is high and the dV/dt is below a particular threshold (e.g., 1.5), the capacitance value is deemed to be high. In such a case, the load is considered to be capacitive and the high current to be a capacitive in-rush current. When the current is high but the dV/dt is above the threshold value, the load capacitance is small, and the high current is deemed to be a result of a resistive short-circuit. For a given current limit, the threshold value of dV/dt may be chosen to be in the high slope are of the dV/dt-vs-capacitance curve to improve detection accuracy.

Figure 3:
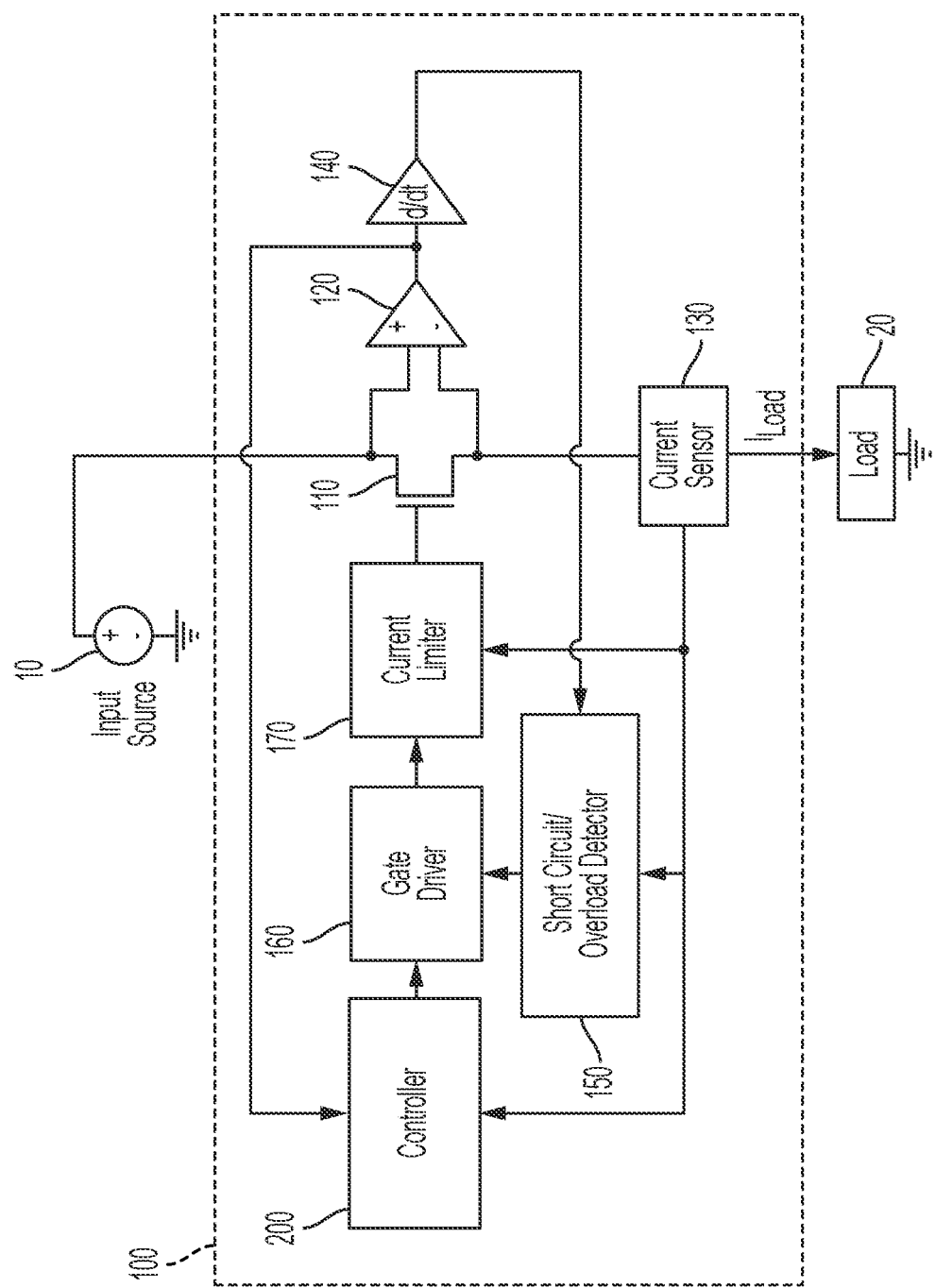
FIG. 3 illustrates a block diagram of the protection device, according to some exemplary embodiments of the present disclosure.

FIG. 3 illustrates a block diagram of the protection device 100, according to some exemplary embodiments of the present disclosure.

In some embodiments, the protection device 100 includes the switch (e.g., the power semiconductor or solid state switch) 110, a voltage sensor 120, a current sensor 130, a differentiator 140, a detector 150, a gate driver 160, and a current limiter (e.g., current limiter circuit) 170. The switch 110 may be a field effect transistor (e.g., an NMOS FET or nFET) having its drain and source terminals connected between the input source 10 and the load 20. The voltage sensor 120 may be an operational amplifier (e.g., an error amplifier) having its input terminals connected across the source and drain terminals of the switch 110, and is configured to measure the voltage drop across the switch 110 (e.g., measure the drain-source voltage $V_{DS}$) and to generate a corresponding switch voltage. The differentiator (e.g., a differentiator circuit) 140 is coupled between the voltage sensor 120 and the detector 150, and is configured to generate a derivative signal (e.g., a voltage signal) corresponding to the rate of change of the voltage drop across the switch 110 ($dV_{DS}$/dt) based on the switch voltage from the voltage sensor 120. The current sensor 130 is connected electrically in series with the switch 110 and is configured to measure the magnitude of the load current $I_{LOAD}$. The current sensor 130 may be a sense resistor the voltage across which corresponds to the current passing through it.

According to some embodiments, the detector (e.g., the short circuit/overload detector) 150 is configured to rapidly detect resistive short-circuit events and capacitive overload conditions based on the load current $I_{LOAD}$ and the rate of change of the voltage drop, and to generate a corresponding switch control signal to control the state (e.g., on/off state) of the switch 110. For example, when the magnitude of the sensed current is high, that is, the sensed current is greater than a first threshold, and the rate of voltage change across the switch 110 is low, that is, the rate of change is less than a second threshold, the detector 150 determines that the high current is a result of a resistive short circuit and generates the switch control signal in such a way as to deactivate/turn off the switch 110. This may prevent damage to the switch 110 and/or the load 20 that may otherwise result from this resistive short-circuit condition. Further, when the magnitude of the sensed current is high, that is, the sensed current is greater than the first threshold, and the rate of voltage change across the switch 110 is also high, that is, the rate of change is greater than or equal to the second threshold, the detector 150 determines that the high current is due to inrush current into a capacitive load and generates the switch control signal in such a way as to maintain the activate/on state of the switch 110. As a result, in such cases, the protection device 100 does not erroneously turn of the switch 110, and allows the high current to pass in order to charge the capacitive load 20. When the magnitude of the sensed current is less than or equal to the first threshold, the detector 150 determines that neither a short-circuit event nor a capacitive overload condition exists, and the detector 150 generates the switch control signal in such a way as to activate or maintain the activated state of the switch 110 and to allow load current to pass through the protection device 100. The first threshold may be a value close to the current limit. However, due to component tolerances, the first threshold may be about 5% to about 15% below the current limit value. The second threshold may be greater than about 0.5 V/s. The upper limit of the second threshold may depend on power handling capability of the switch 110, safety margin, the capacitive load, the current limit, and the system voltage.

In the description herein, rather than use the term "derivative signal", references are generally made to the "rate of change of the switch voltage", the "rate of change of the voltage drop across the switch", or the like. This is done to better convey the concept behind the invention. However, as will be understood by a person of ordinary skill in the art, in the implementation of the protective device 100, the determinations made based on the "rate of change of the switch voltage" or the "rate of change of the voltage drop across the switch" may in fact be based upon the corresponding derivative signal, which may be a voltage signal.

The gate driver 160 generates a gate control signal to activate or deactivate switch 110 based at least on the switch control signal from the detector 150. The current limiter 170 ensures that the load current $I_{LOAD}$ passing through the switch 110 does not exceed a current limit. In some examples, the current limit may be about 50 A to about 1200 A. The current limit may be set to about 10 times the channel current rating.

The protection device 100 may also include a controller 200, which monitors the load current $I_{LOAD}$ (from the current sensor 130) and the voltage drop across the switch 110 (from the voltage sensor 120), and provides I2t (current squared through time) overload protection, as well as other functions (such as turning the switch on/off) by transmitting a control signal to the gate driver 160. The controller may also provide reporting functions (such as reporting current and voltage information) to external circuit.

Figure 4A:
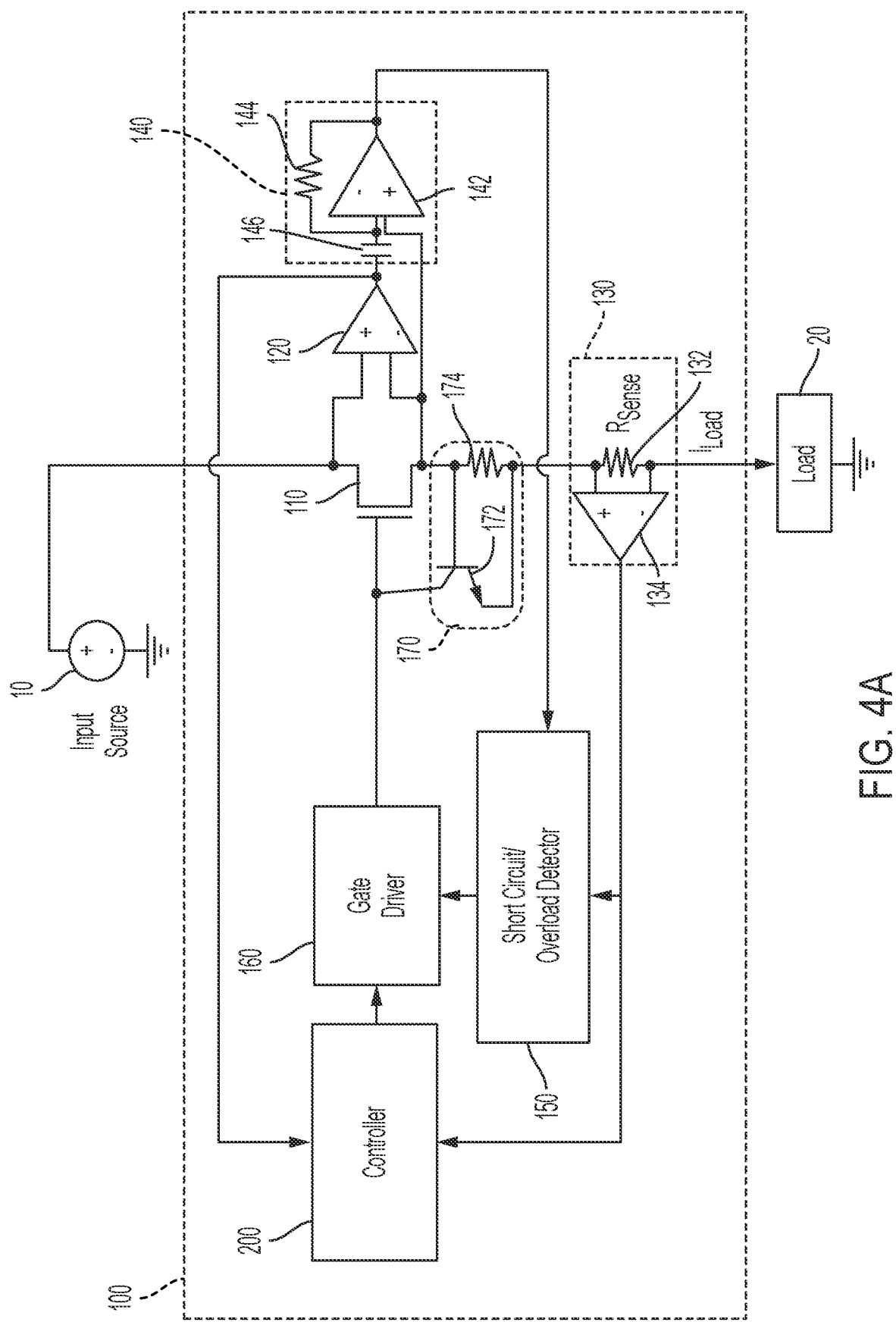
FIG. 4A illustrates an implementation of the protection circuit, according to some embodiments of the present disclosure.
Figure 4B:
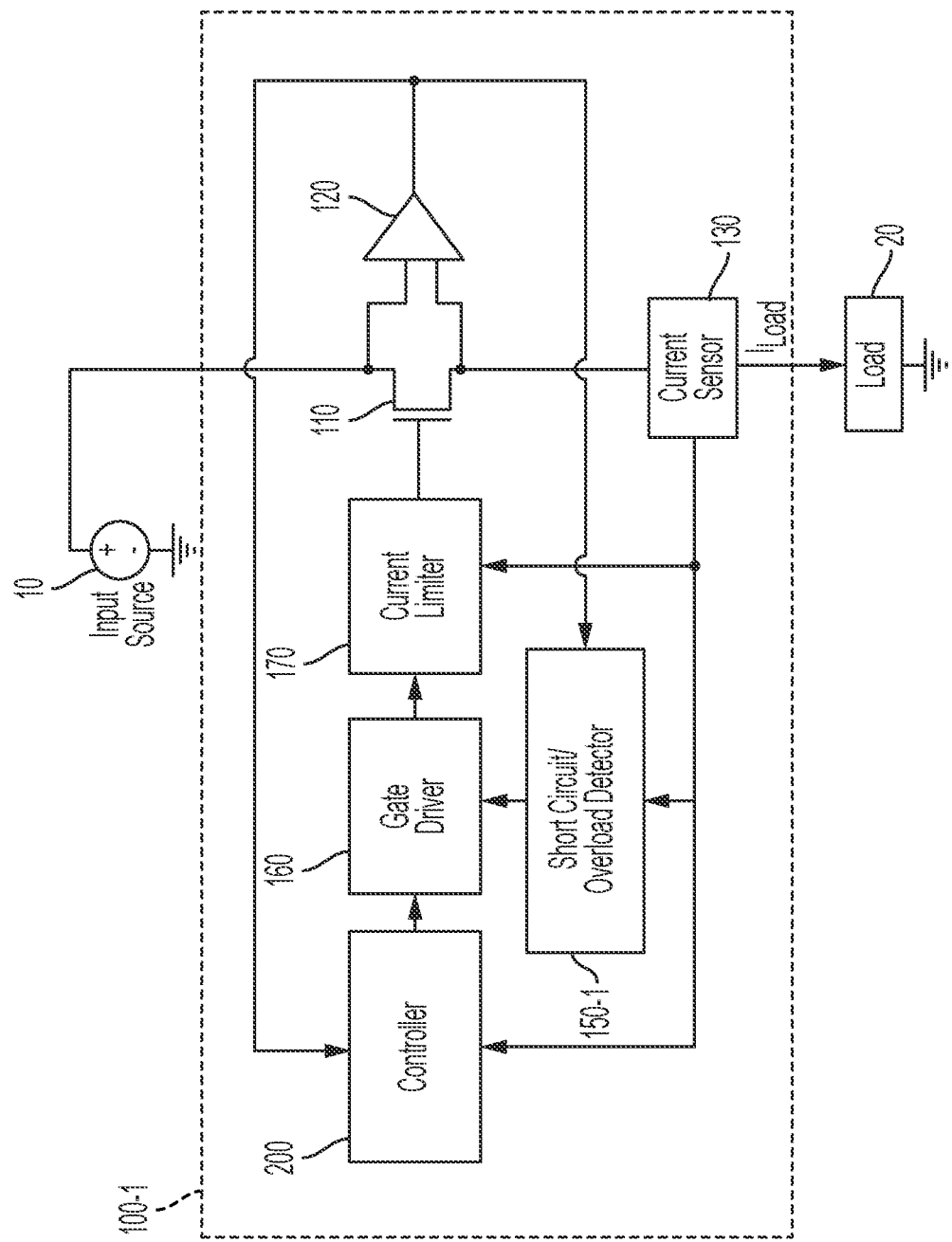
FIG. 4B illustrates a block diagram of the protection device in which differentiation is performed by the detector, according to some exemplary embodiments of the present disclosure.
Figure 4C:
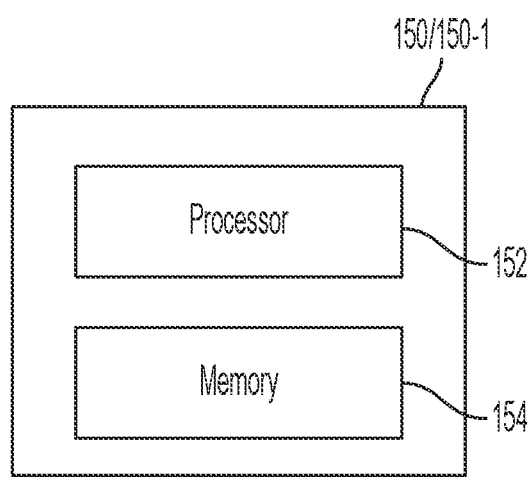
FIG. 4C illustrates an implementation of the detector, according to some embodiments of the present disclosure.

FIG. 4A illustrates an implementation of the protection device 100, according to some embodiments of the present disclosure. FIG. 4B illustrates a block diagram of the protection device 100-1 in which differentiation is performed by the detector 150-1, according to some exemplary embodiments of the present disclosure. FIG. 4C illustrates an implementation of the detector 150/150-1, according to some embodiments of the present disclosure.

The current sensor 130 may include a sense resistor 132 coupled electrically in series with the switch 110 and the load 20, and a first error amplifier 134 coupled across the first error amplifier 134 for generating a signal corresponding to load current $I_{LOAD}$ for transmission to the detector 150 and the controller 200.

As shown in FIG. 4A, the current limiting functions of the current limiter 170 may be achieved by way of a bipolar junction transistor (BJT) 172 (e.g., an NPN BJT), which provides a feedback mechanism to limit the current passing through the switch 110. When the voltage drop across the first resistor 174 exceeds the base-emitter voltage of the BJT (e.g. 0.6 V), the gate of the MOSFET 110 begins to pinch off and current through the MOSFET 110 is limited. Further signal conditioning blocks may be implemented to achieve an application's specific needs, such as precision, speed, stability, and complexity. However, embodiments of the present disclosure are not limited to the current limiter 170, and any suitable circuit may be utilized.

In some examples, a hardware implementation of the differentiator 140 includes an op-amp differentiator circuit having an op-amp 142, a second resistor 144, and a capacitor 146 in the shown configuration. In addition to the elements shown in the differentiator circuit 140 of FIG. 4, other components may be utilized to set the gain and frequency response of the differentiator 140, thus tuning the transfer function to a particular desired application of the protection device 100. However, embodiments of the present disclosure are not limited to the circuit implementation of the differentiator 140, and the differentiator may also be implemented by means of software that monitors the voltage generated by the voltage sensor 120 an employs a digital algorithm and filtering to determine $dV_{DS}/dt$. In such examples, the differentiator may be incorporated within the detector 150-1, which received the voltage reading from the voltage sensor 120 and performs the differentiation operation to calculate the rate of change of the voltage drop across the switch 110. This is illustrated in FIG. 4B.

As shown in FIG. 4C, the detector 150/150-1 may include a processing circuit (e.g., a processor or central processing circuit (CPU) 152 and a memory 154 that includes instructions that when executed by the processor 152 perform the operations described above with respect to the detector 150/150-1.

The terms "processing circuit" and "processor" are used herein to include any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general purpose hardware, such as a CPU, configured to execute instructions stored in a non-transitory storage medium. A processing circuit may be fabricated on a single printed wiring board (PWB) or distributed over several interconnected PWBs. A processing circuit may contain other processing circuits; for example, a processing circuit may include two processing circuits, an FPGA and a CPU, interconnected on a PWB.

Figure 5A:
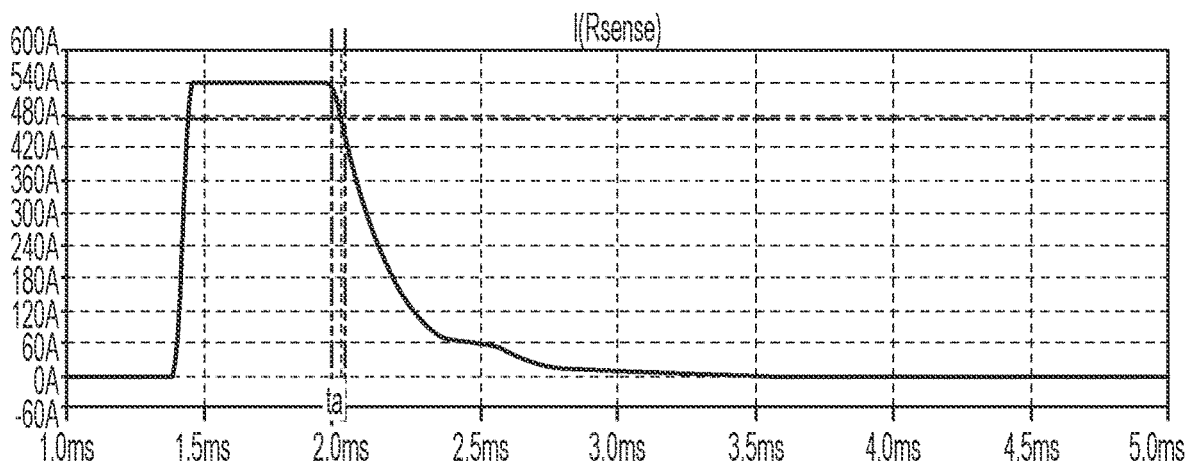
FIGS. 5A-5C illustrate the turn-on and inrush current control of the protection device 100, according to some embodiments of the present disclosure.
Figure 5B:
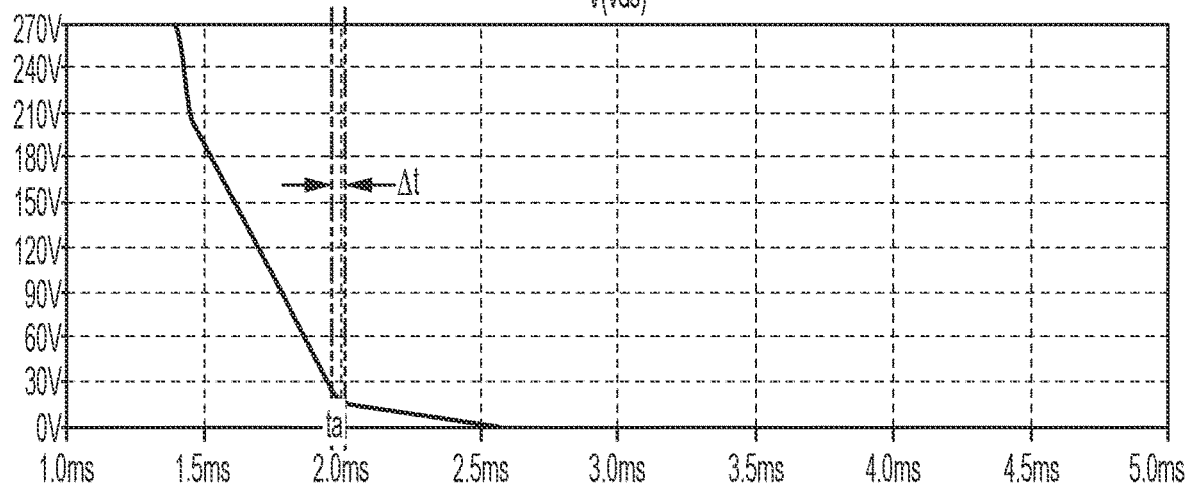
Figure 5C:
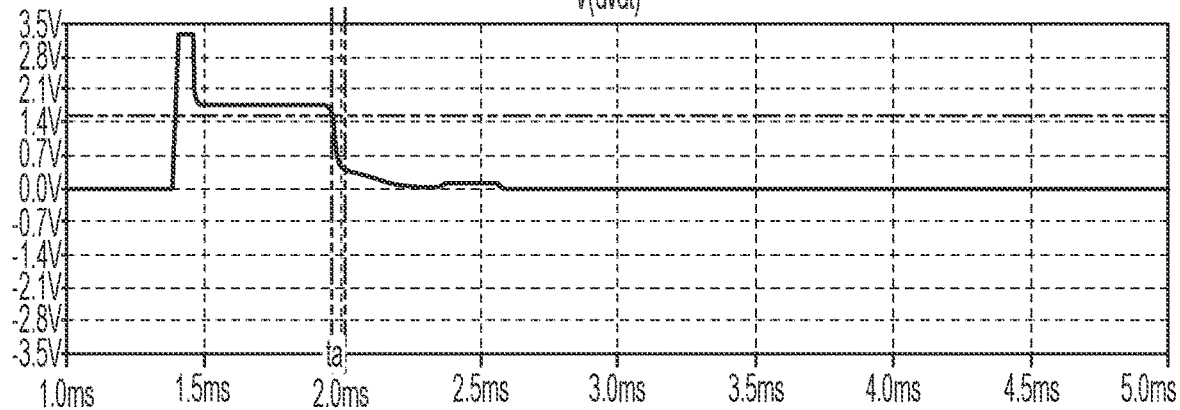

FIGS. 5A-5C illustrate the turn-on and inrush current control of the protection device 100, according to some embodiments of the present disclosure. FIG. 5A illustrates the change in current passing through the switch 110, according to some embodiments of the present disclosure. FIG. 5B illustrates the change in the voltage drop across the switch 110, according to some embodiments of the present disclosure. FIG. 5C illustrates the output of the differentiator circuit corresponding to the rate of change of the switch voltage, according to some embodiments of the present disclosure.

Referring to FIGS. 5A-5C, when the protection device 100 is first turned on into a capacitive load, nearly the entirety of the input voltage (e.g., 270 V) appears across the switch 110 (see, FIG. 5B), and the load current rapidly surges from zero to a high value, which is capped at a maximum value (e.g., 540 A) by the current limiter 170 (see, FIG. 5A). The magnitude of the load current may remain capped at this value for some time (e.g., about 0.6 mS) while the capacitive load is being charged. During this time, the rate of change of the switch voltage ($dV_{DS}/dt$) is constant (see, Equation 1, FIG. 5C), which is reflected by the linear drop in switch voltage ($V_{DS}$; see, FIG. 5B). In the example of FIGS. 5A-5C, the constant rate of change of the switch voltage drop is greater than the second threshold, which is set at 1.5 V. As such, despite the high switch current exceeding the first threshold of about 450 A, the protection device 100 correctly recognizes the high current as inrush current of a capacitive load (and not as a short-circuit current) and does not deactivate the switch 110, which allows the capacitive load to continue charging.

As the capacitive load 20 is charged, the load voltage of the capacitive load 20 is increased and the current passing through the switch drops below the current limit and gradually reduces to zero (FIG. 5A). As a result, the switch voltage ($V_{DS}$) and its rate of change also gradually drops zero.

In some embodiments, when the protective device 100 detects a potential short circuit event (i.e., $I_{LOAD}$>the first threshold and $dV_{DS}/dt$<second threshold), the protective device does not trip (or deactivate) the switch 110 unless this condition persists for at least a period of time $\Delta t$ (e.g., about 50 µS), which is referred to as a hold-off period. As such, at time ta, even though the load current exceeds the first threshold, because after the hold-off period $\Delta t$, the load current is below the first threshold and the short-circuit conditions are no longer present, the protection device 100 does not incorrectly trip the switch 110 and a nuisance trip is avoided.

Figure 6A:
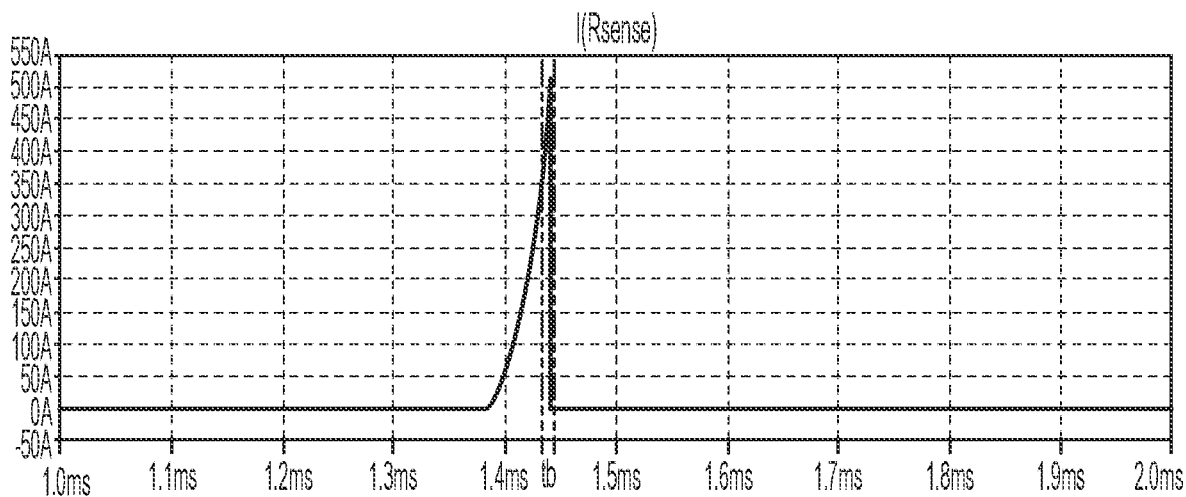
FIGS. 6A-6C illustrate the trip functionality of protection device when a short circuit condition is detected, according to some embodiments of the present disclosure.
Figure 6B:
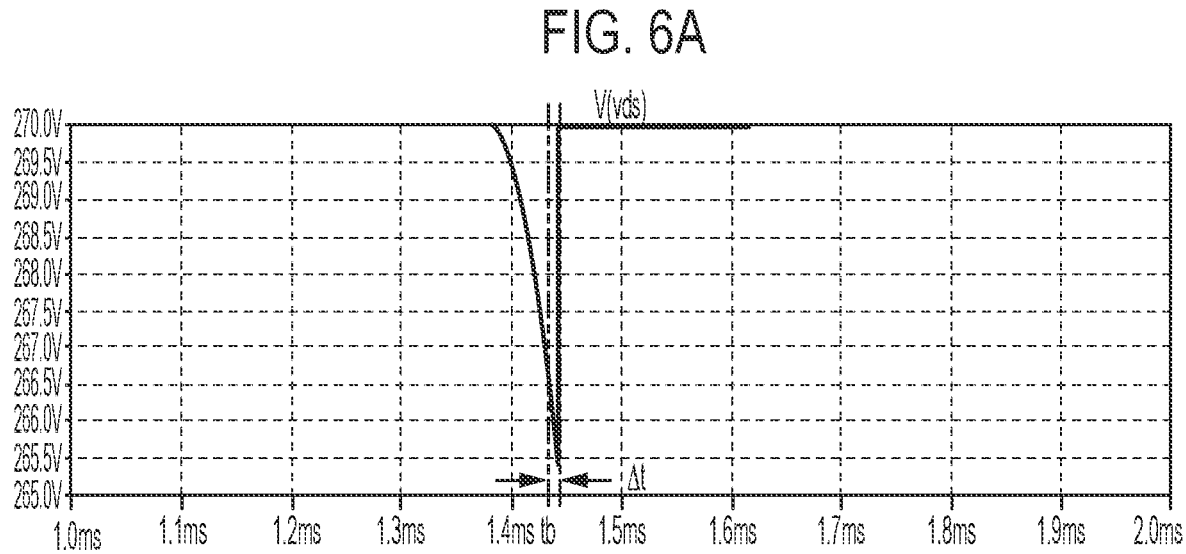
Figure 6C:
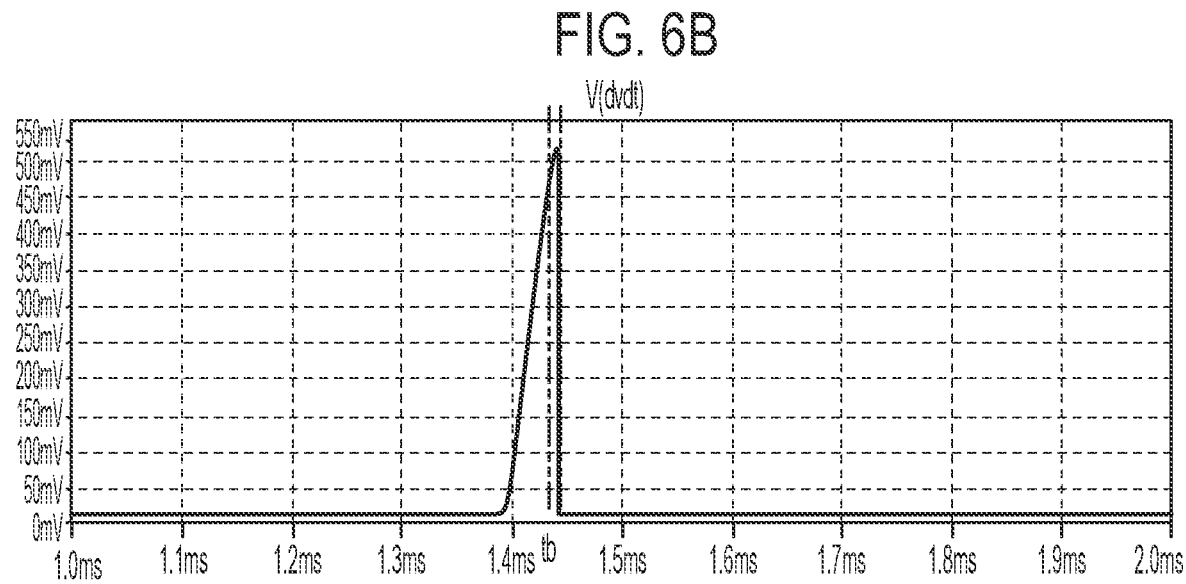

FIGS. 6A-6C illustrate the trip functionality of protection device 100 when a short circuit condition is detected, according to some embodiments of the present disclosure.

Referring to FIGS. 6A-6C, when the protection device is first turned on into a resistive short circuit, nearly the entirety of the input voltage (e.g., 270 V) appears across the switch 110 (see, FIG. 6B), and the load current rapidly surges from zero to a high value (see, FIG. 6A). When the sensed load current surpasses the first threshold (e.g., 450 A) at time tb, the rate of change of the voltage drop across the switch ($dV_{DS}/dt$) is less than the second threshold (e.g., 1.5 V). As such, the protection device 100 determines that a resistive short-circuit condition is present. After a period of time equal to the hold-off period $\Delta t$ (e.g., about 12 µS in the example of FIGS. 6A-6C), the conditions for the resistive short-circuit are still present, and so the protection device 100 signals the gate driver 160 to deactivate the switch 110. This results in an immediate shutdown of the load current (see, FIG. 6A), which prevents damage to the switch 110 and the load 20.

Figure 7:
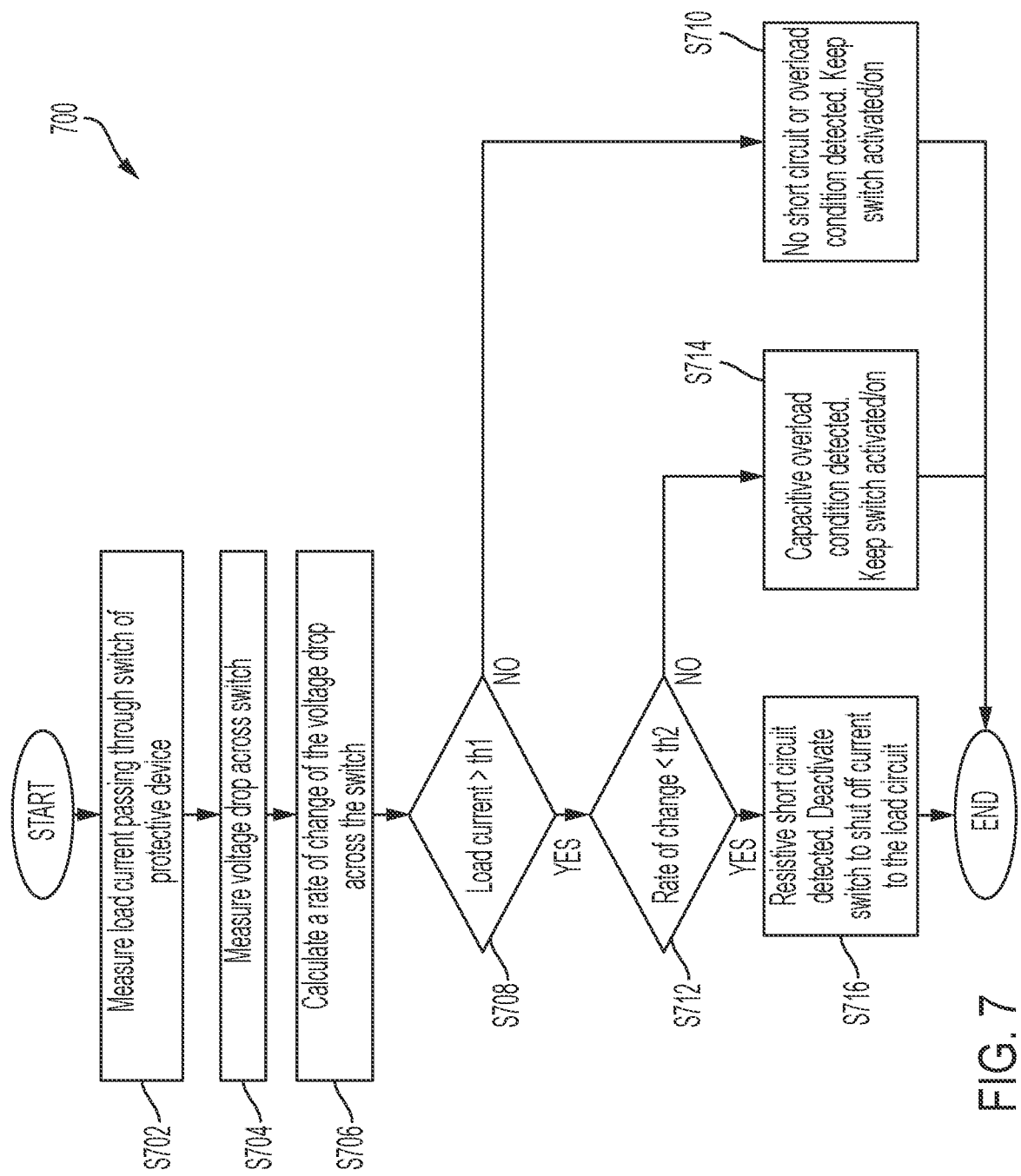
FIG. 7 is a flow diagram illustrating a process of protecting the load circuit, according to some embodiments of the present disclosure.

FIG. 7 is a flow diagram illustrating a process 700 of protecting the load circuit 20, according to some embodiments of the present disclosure.

In some embodiments, the protection device 100 (e.g., the current sensor 130) senses the load current $I_{LOAD}$ passing through the switch 110 (S702), and senses the voltage drop across the switch 110 via the voltage sensor 120 (S704). The protection device 100 (e.g., the differentiator 140) determines a rate of change of the voltage drop across the switch 110 (S706).

The protection device 100 (e.g., the detector 150) then determines whether to deactivate the switch 110 based on the load current and the rate of change of the voltage drop across the switch (S708-S716). In so doing, the protection device 100 determines whether the load current is above the first threshold (S708). When the load current is less than or equal to the first threshold (i.e., when the magnitude of the load current is low), the protection device 100 determines that no short circuit event or capacitive overload condition exists, and activates or maintains the activated state of the switch 110 (S710).

When the load current is greater than the first threshold (i.e., when the magnitude of the load current is high), the resistor short circuit condition or a capacitive inrush current may be present, and the protection device 100 attempts to distinguish these two conditions by determining whether the rate of change of the voltage drop across the switch is less than a second threshold (S712). When the rate of change is greater than or equal to the second threshold (i.e., the rate of change is high), the protection device 100 determines that a capacitive load is present and allows the current to pass through the switch 110 by keeping the switch 110 activated (S714), thus avoiding an erroneous nuisance trip. When the rate of change is less than the second threshold (i.e., the rate of change is low), the protection device 100 determines that a resistive short-circuit is present at the load 20. After detecting a short-circuit event, the protection device 100 monitors the load current and rate of change for the duration of the hold-off period $\Delta t$ (e.g., about 50 µS). If the short-circuit event is still present after passage of the hold-off period $\Delta t$, the protection circuit 100 proceeds to deactivate the switch to shut off the high current passing to the load 20 (S716). The hold-off period allows the protection circuit to avoid nuisance trips of the switch 110.

Accordingly, the protection device 100 is capable of quickly differentiating between resistive and capacitive inrush currents by using measured time rate of change of voltage and magnitude of inrush current to avoid nuisance trips while facilitating simpler wire/load protection circuit designs to protect against resistive short-circuits. This solution also provides the switching capability for capacitive load systems or pulse energy loads to operate with the fast switching time without pre-charge or soft-start functionality, which are costly and have slow response.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include", "including", "comprises", and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of", when preceding a list of elements, modify the entire list of elements and do not modify the individual elements of the list. Further, the use of "may" when describing embodiments of the inventive concept refers to "one or more embodiments of the inventive concept". Also, the term "exemplary" is intended to refer to an example or illustration.

It will be understood that, although the terms "first", "second", "third", etc., may be used herein to describe various elements, components, and/or sections, these elements, components, and/or sections should not be limited by these terms. These terms are used to distinguish one element, component, or section from another element, component, or section. Thus, a first element, component, or section discussed below could be termed a second element, component, or section, without departing from the scope of the inventive concept.

It will be understood that when an element is referred to as being "connected to" or "coupled to " another element, it can be directly connected to or coupled to the other element, or one or more intervening elements may be present. When an element is referred to as being "directly connected to" or "directly coupled to" another element, there are no intervening elements present.

As used herein, the terms "use", "using", and "used" may be considered synonymous with the terms "utilize", "utilizing", and "utilized", respectively.

The protection device and/or any other relevant devices or components according to embodiments of the present invention described herein, such as the controller and the detector, may be implemented utilizing any suitable hardware, firmware (e.g. an application-specific integrated circuit), software, or a suitable combination of software, firmware, and hardware. For example, the various components of the protection device may be formed on one integrated circuit (IC) chip or on separate IC chips. Further, the various components of the protection device may be implemented on a flexible printed circuit film, a tape carrier package (TCP), a printed circuit board (PCB), or formed on a same substrate. Further, the various components of the protection device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While this disclosure has been described in detail with particular references to illustrative embodiments thereof, the embodiments described herein are not intended to be exhaustive or to limit the scope of the disclosure to the exact forms disclosed. Persons skilled in the art and technology to which this disclosure pertains will appreciate that alterations and changes in the described structures and methods of assembly and operation can be practiced without meaningfully departing from the principles, and scope of this disclosure, as set forth in the following claims and equivalents thereof.

What is claimed is:

1. A method of protecting a load circuit, the method comprising:
   sensing a load current passing through a switch electrically in series with the load circuit;
   sensing a voltage drop across the switch;
   determining a rate of change of the voltage drop across the switch;
   determining whether to deactivate the switch based on the load current and the rate of change of the voltage drop across the switch; and
   in response to determining to deactivate the switch, deactivating the switch to shut off current to the load circuit.

2. The method of claim 1, wherein the determining whether to deactivate the switch comprises:
   determining whether the load current is above a first threshold;
   determining whether the rate of change of the voltage drop is less than a second threshold; and
   in response to determining that the load current is above the first threshold and that the rate of change of the voltage drop is less than the second threshold, determining to deactivate the switch.

3. The method of claim 1, further comprising:
   in response to determining not to deactivate the switch, maintaining activation of the switch.

4. The method of claim 1, wherein the determining whether to deactivate the switch comprises:
   determining whether the load current is above a first threshold;
   determining whether the rate of change of the voltage drop is less than a second threshold; and
   in response to determining that the load current is less than or equal to the first threshold or that the rate of change of the voltage drop is greater than or equal to the second threshold,
   determining not to deactivate the switch.

5. The method of claim 4, wherein the first threshold is less than a current rating of the switch.

6. The method of claim 1, wherein the switch comprises a field effect transistor (FET).

7. A protection device coupled to a load circuit, the protection device comprising:
   a switch electrically in series with the load circuit;
   a current sensor configured to sense a load current passing through the switch;
   a voltage sensor configured to measure a voltage drop across the switch;
   a detector configured to generate a switch control signal based on the load current and a rate of change of the voltage drop; and
   a gate driver configured to selectively activate and deactivate the switch based on the switch control signal.

8. The protection device of claim 7, wherein the switch comprises:
   a field effect transistor (FET) having a gate electrode coupled to the gate driver, and a source electrode coupled to the load circuit.

9. The protection device of claim 7, wherein the current sensor comprises:
   a sense resistor coupled electrically in series with the switch and the load circuit, and
   wherein the voltage sensor comprises:
      an error amplifier having input terminals coupled across the switch and configured to generate a switch voltage corresponding to the voltage drop across the switch.

10. The protection device of claim 7, further comprising:
    a differentiator coupled between the voltage sensor and the detector, and configured to generate a derivative signal corresponding to the rate of change of the voltage drop across the switch based on a switch voltage from the voltage sensor.

11. The protection device of claim 7, wherein the detector is further configured to receive the voltage drop across the switch from the voltage sensor and to calculate the rate of change of the voltage drop based on the voltage drop.

12. The protection device of claim 7, wherein the detector is configured to perform:
    determining whether the load current is above a first threshold;

determining whether the rate of change of the voltage drop is less than a second threshold; and in response to determining that the load current is above the first threshold and that the rate of change of the voltage drop is less than the second threshold, generating the switch control signal to correspond to deactivation of the switch.

13. The protection device of claim 7, wherein the detector is configured to perform:

determining whether the load current is above a first threshold;

determining whether the rate of change of the voltage drop is less than a second threshold; and in response to determining that the load current is less than or equal to the first threshold or that the rate of change of the voltage drop is greater than or equal to the second threshold, generating the switch control signal to correspond to maintaining activation of the switch.

14. The protection device of claim 7, further comprising:

a current limiter circuit coupled between the gate driver and the switch, and configured to limit the load current to a current limit.

15. The protection device of claim 14, wherein the current limiter circuit comprises:

a bipolar junction transistor (BJT) having a base, an emitter, and a collector coupled to a gate of the switch, the current sensor being coupled between the base and emitter of the BJT.

16. The protection device of claim 7, further comprising:

a controller configured to receive the load current and the voltage drop across the switch, and to signal the gate driver to deactivate the switch based on the load current and the voltage drop.

17. The protection device of claim 7, wherein the switch comprises a field effect transistor (FET).

\* \* \* \* \*